(12) United States Patent
Cliff et al.

(10) Patent No.: US 6,646,467 B1
(45) Date of Patent: Nov. 11, 2003

(54) PCI-COMPATIBLE PROGRAMMABLE LOGIC DEVICES

(75) Inventors: Richard G. Cliff, Milpitas, CA (US); Francis B. Heile, Santa Clara, CA (US); Joseph Huang, San Jose, CA (US); David W. Mendel, Sunnyvale, CA (US); Bruce B. Pendersen, San Jose, CA (US); Chiakang Sung, Milpitas, CA (US); Kerry Veenstra, San Jose, CA (US); Bonnie I. Wang, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/147,200

(22) Filed: May 17, 2002

Related U.S. Application Data

(60) Continuation of application No. 09/898,552, filed on Jul. 3, 2001, now abandoned, which is a continuation of application No. 09/395,886, filed on Sep. 14, 1999, now Pat. No. 6,271,681, which is a division of application No. 08/919,988, filed on Aug. 28, 1997, now Pat. No. 6,127,844.
(60) Provisional application No. 60/038,289, filed on Feb. 20, 1997.

(51) Int. Cl.[7] .............................................. H03K 19/177
(52) U.S. Cl. ........................................... 326/41; 326/93
(58) Field of Search ............................. 326/39–41, 37, 326/93, 101; 327/262

(56) References Cited

U.S. PATENT DOCUMENTS

| 3,473,160 | A | 10/1969 | Wahlstrom ................ 340/172.5 |
| 4,609,986 | A | 9/1986 | Hartmann et al. ........... 364/200 |
| 4,617,479 | A | 10/1986 | Hartmann et al. ........... 307/465 |
| 4,642,487 | A | 2/1987 | Carter ......................... 307/465 |
| 4,677,318 | A | 6/1987 | Veenstra ...................... 307/465 |
| 4,713,792 | A | 12/1987 | Hartmann et al. ........... 364/900 |
| 4,758,745 | A | 7/1988 | Elgamal et al. .............. 307/465 |
| 4,772,811 | A | * 9/1988 | Fujioka et al. ................. 326/41 |
| 4,774,421 | A | 9/1988 | Hartmann et al. ........... 307/465 |
| 4,871,930 | A | 10/1989 | Wong et al. ................. 307/465 |

(List continued on next page.)

FOREIGN PATENT DOCUMENTS

| EP | 463746 A2 | 1/1992 | ........... G06F/15/60 |
| EP | 630115 A2 | 12/1994 | ......... H03K/19/177 |
| WO | WO 95/04404 | 2/1995 | ......... H03K/19/177 |
| WO | WO 95/22205 | 8/1995 | ......... H03K/19/177 |

OTHER PUBLICATIONS

R. C. Minnick, "A Survey of Microcellular Research," Journal of the Association for Computing Machinery, vol. 14, No. 2, pp. 203–241, Apr. 1967.
S. E. Wahlstrom, "Programmable Logic Arrays—Cheaper by the Milions," Electronics, Dec. 11, 1967, pp. 90–95.
*Recent Developments in Switching Theory*, A. Mukhopadhyay, ed., Academic Press, New York, 1971, chapters VI and IX, pp. 229–254 and 369–422.

(List continued on next page.)

*Primary Examiner*—Michael Tokar
*Assistant Examiner*—James Cho
(74) *Attorney, Agent, or Firm*—Fish & Neave; Robert B. Jackson

(57) ABSTRACT

A programmable logic integrated circuit device has several features which help it perform according to the PCI Special Interest Group's Peripheral Component Interface ("PCI") signaling protocol. Some of the registers on the device are closely coupled for data input and output to data signal input/output pins of the device. The clock signal input terminals of at least these registers are also closely coupled to the clock signal input pin of the device. Programmable input delay is provided between the data signal input/output pins and the data input terminals of the above-mentioned registers to help compensate for clock signal skew on the device.

16 Claims, 5 Drawing Sheets

U.S. PATENT DOCUMENTS

| | | | |
|---|---|---|---|
| 4,899,067 A | 2/1990 | So et al. ...................... 307/465 |
| 4,912,342 A | 3/1990 | Wong et al. ................. 307/465 |
| 5,023,485 A * | 6/1991 | Sweeney ..................... 326/16 |
| 5,023,606 A | 6/1991 | Kaplinsky ................ 340/825.8 |
| 5,027,315 A * | 6/1991 | Agrawal et al. .............. 326/38 |
| 5,073,729 A | 12/1991 | Greene et al. ........... 307/465.1 |
| 5,107,153 A | 4/1992 | Osaki et al. ................. 307/601 |
| 5,121,006 A | 6/1992 | Pedersen ..................... 307/465 |
| 5,122,685 A | 6/1992 | Chan et al. .............. 307/465.1 |
| 5,132,571 A | 7/1992 | McCollum et al. ...... 307/465.1 |
| 5,144,166 A | 9/1992 | Camarota et al. ........ 307/465.1 |
| 5,208,491 A | 5/1993 | Ebeling et al. ............. 307/465 |
| 5,218,240 A | 6/1993 | Camarota et al. ........... 307/443 |
| 5,220,214 A | 6/1993 | Pedersen ..................... 307/465 |
| 5,225,719 A | 7/1993 | Agrawal et al. ............ 307/465 |
| RE34,363 E | 8/1993 | Freeman ..................... 307/465 |
| 5,255,203 A | 10/1993 | Agrawal et al. ............ 364/489 |
| 5,258,668 A | 11/1993 | Cliff et al. ................... 307/465 |
| 5,260,610 A | 11/1993 | Pedersen et al. ............ 307/465 |
| 5,260,611 A | 11/1993 | Cliff et al. ................... 307/465 |
| 5,274,581 A | 12/1993 | Cliff et al. ................... 364/784 |
| 5,338,984 A | 8/1994 | Sutherland ............... 307/465.1 |
| 5,350,954 A | 9/1994 | Patel ........................ 307/465 |
| 5,362,999 A | 11/1994 | Chiang ......................... 326/44 |
| 5,371,422 A | 12/1994 | Patel et al. ................... 326/41 |
| 5,448,186 A | 9/1995 | Kawata ........................ 326/41 |
| 5,455,525 A | 10/1995 | Ho et al. ...................... 326/41 |
| 5,467,029 A | 11/1995 | Taffe et al. ................... 326/41 |
| 5,469,003 A | 11/1995 | Kean ............................ 326/39 |
| 5,477,178 A | 12/1995 | Maki ........................... 327/161 |
| 5,483,178 A | 1/1996 | Costello et al. ............... 326/41 |
| 5,509,128 A | 4/1996 | Chan .......................... 395/311 |
| 5,648,732 A | 7/1997 | Duncan ....................... 326/40 |
| 5,689,195 A | 11/1997 | Cliff et al. .................... 326/41 |
| 5,841,296 A | 11/1998 | Churcher et al. ............. 326/49 |

OTHER PUBLICATIONS

*The Programmable Gate Array Data Book*, 1988, Xilinx, Inc., San Jose, CA.

El Gamal et al., "An Architecture for Electrically Configurable Gate Arrays," IEEE Journal of Solid–State Circuits, vol. 24, No. 2, Apr. 1989, pp. 394–398.

El–Ayat et al., "A CMOS Electrically Configurable Gate Array," IEEE Journal of Solid–State Circuits, vol. 24, No. 3, Jun. 1989, pp. 752–762.

*ACT Family Field Programmable Gate Array Databook*, Apr. 1992, Actel Corporation, Sunnyvale, CA, pp. 1–35 through 1–44.

*The Programmable Logic Data Book*, 1994, Xilinx, Inc., San Jose, CA, pp. 2–7, 2–12, and 2–13.

"XC5000 Logic Cell Array Family, Technical Data, Advance Information," Xilinc, Inc., Feb. 1995.

\* cited by examiner

PCI-COMPATIBLE PROGRAMMABLE LOGIC DEVICES

CROSS REFERENCE TO RELATED APPLICATION

This is a continuation of U.S. patent application Ser. No. 09/898,552, filed Jul. 3, 2001 (now abandoned) which is a continuation of U.S. patent application Ser. No. 09/395,886, filed Sep. 14, 1999 (now U.S. Pat. No. 6,271,681), which is a division of U.S. patent application Ser. No. 08/919,988, filed Aug. 28, 1997 (now U.S. Pat. No. 6,127,844) and which claims the benefit of U.S. provisional patent application No. 60/038,289, filed Feb. 20, 1997. All of these references are hereby incorporated by reference herein in their entireties.

BACKGROUND OF THE INVENTION

This invention relates to programmable logic integrated circuit devices, and more particularly to constructing and operating such devices so that they are compatible with the PCI Special Interest Group's Peripheral Component Interface ("PCI") bus signaling protocol.

The PCI Special Interest Group's PCI bus signaling protocol has become widely accepted. At present the PCI standard is a 32 bit bus with a 33 MHZ clock and stringent requirements regarding TCO (time from clock to output: no more than 11 nanoseconds), TCZ (time from clock to high impedance: no more than 11 nanoseconds), TSU (time for setup: no more than 7 nanoseconds), and THD (hold time: no more than 0 nanoseconds). To meet the PCI standard a device must therefore be able to (1) output data very rapidly following a PCI clock signal (TCO), (2) release the PCI bus very rapidly following a PCI clock signal (TCZ), (3) set up to input data very shortly before a PCI clock signal (TSU), and (4) require data to remain present no longer than arrival of a PCI clock signal (THD).

Programmable logic devices have not generally been designed to meet the PCI standard, and it is accordingly difficult or impossible for most such devices to meet that standard. It is therefore difficult or impossible for most programmable logic devices to interface with a PCI bus. This is a limitation on the usefulness of programmable logic devices which is becoming increasingly important as the PCI standard becomes more widely used.

In view of the foregoing, it is an object of this invention to provide programmable logic devices which meet PCI bus standards.

SUMMARY OF THE INVENTION

This and other objects of the invention are accomplished in accordance with the principles of the invention by providing programmable logic devices having at least some registers that are relatively closely coupled to data signal input/output pins of the device. For example, there is relatively little signal switching between (1) the input and output terminals of these registers and (2) the data input/output pins of the device. The clock signal input terminals of these registers are also relatively closely coupled to the clock signal input pin of the device (i.e., again there is little or no signal switching between the clock signal input pin of the device and the clock signal input terminals of these registers). These registers preferably supply both output data and output enable signals to tri-state drivers that drive the input/output pins. These characteristics help the device meet the PCI TCO and TCZ requirements. Programmable delay may be provided between input/output pins of the device and the data signal input terminals of adjacent registers to compensate for clock signal skew (e.g., from one side of the device to the other). This helps the device meet the PCI TSU and THD requirements.

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
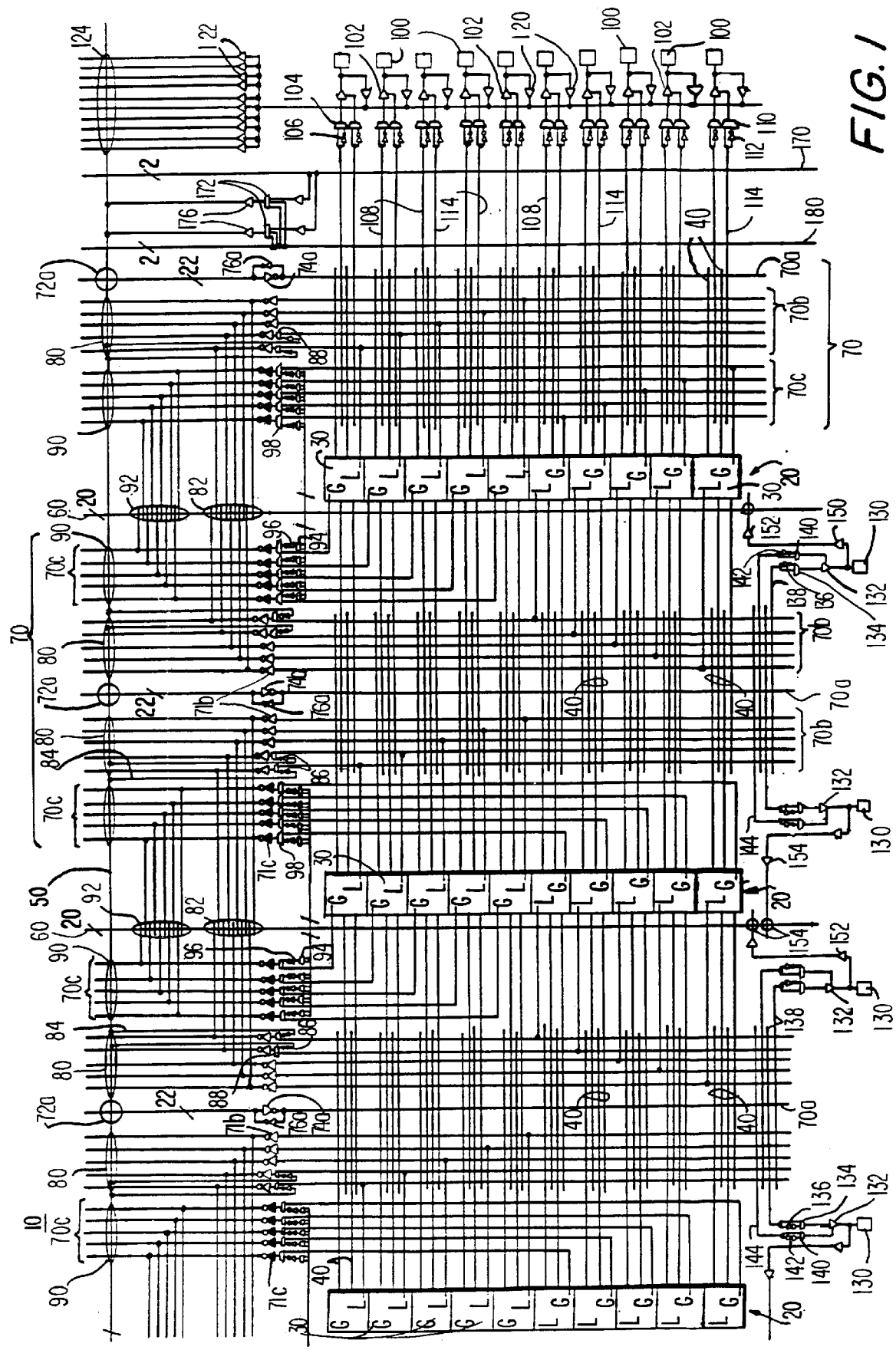
FIG. 1 is a simplified schematic block diagram of a representative portion of an illustrative programmable logic integrated circuit device constructed in accordance with this invention.

The representative portion of illustrative programmable logic device 10 shown in FIG. 1 is the lower right-hand corner of that device. Device 10 includes plural regions 20 of programmable logic disposed on the device in several intersecting rows and columns of such regions. Thus the three representative regions 20 shown in FIG. 1 are the three right-most regions in the bottom row, and the bottom-most region in each of the three right-most columns of regions 20.

Figure 2:
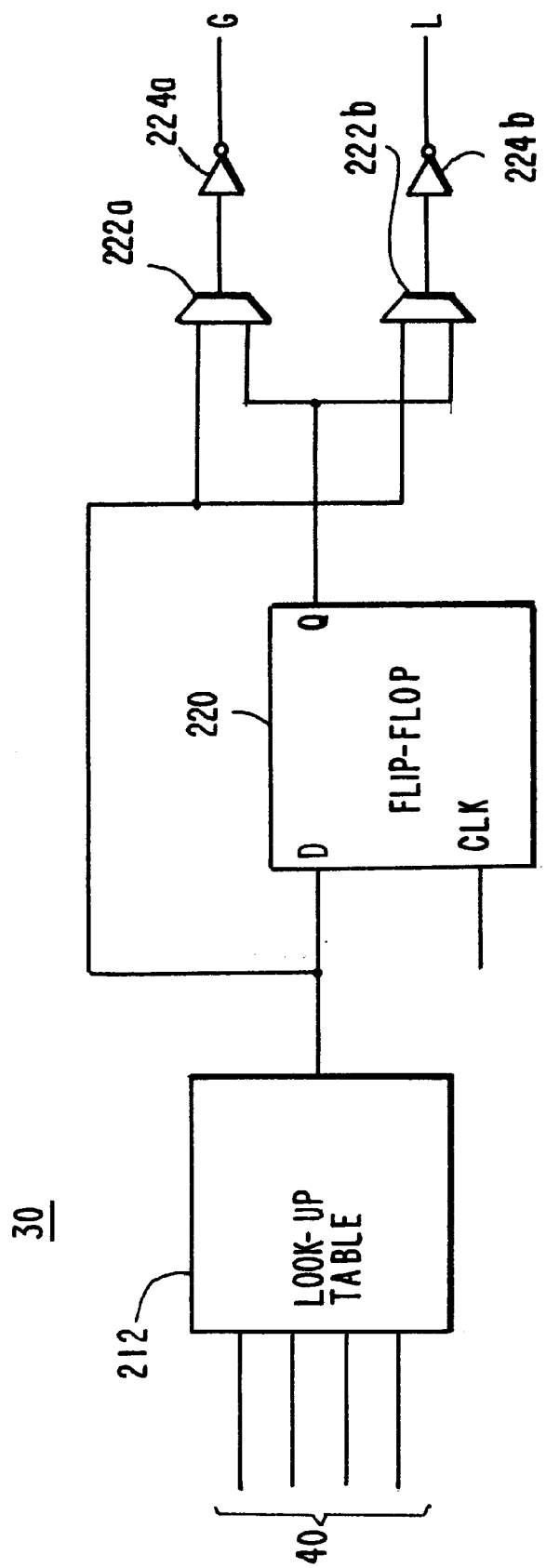
FIG. 2 is a simplified schematic block diagram of an illustrative embodiment of portions of the FIG. 1 device.

Each region 20 includes a plurality of subregions of programmable logic 30. In the particular example shown in FIG. 1 each subregion 20 includes ten subregions 30. (The terms region and subregion are used purely as relative terms, and other relative terms could be used if desired. For example, regions 20 could be referred to as super-regions 20 and subregions 30 could be referred to as regions 30.) Each subregion 30 is programmable to perform any of several relatively elementary logic functions on several data input signals 40 applied to that subregion. For example and as shown in FIG. 2, each subregion 30 may include a four-input look-up table 212 which is programmable to produce an output signal that is any logical combination of the four inputs 40 to the look-up table. Each subregion 30 may additionally include a register 220 (e.g., a flip-flop) and programmable logic connectors ("PLCs") 222a and 222b (e.g., switches) for allowing the look-up table output signal to be either directly output by the subregion or registered by the register and then output by the subregion. Flip-flop 220 has a data input terminal D, a clock input terminal CLK, and a data output terminal Q. Each of the local ("L") and global ("G") outputs of each subregion 30 may be either the combinatorial (unregistered) or registered output of the subregion. Drivers 224a and 224b amplify these signals. The illustrative subregion structure shown in FIG. 2 is somewhat simplified, and a more fully featured embodiment of a suitable subregion structure is shown in Cliff et al. U.S. Pat. No. 5,999,015, file Jul. 29, 1997, which is hereby incorporated by reference herein in its entirety.

Each row of regions 20 has an associated plurality of inter-region interconnection conductors 50. In the illustrative embodiment shown in FIG. 1 each group of conductors 50 includes 96 global horizontal conductors that extend along the entire length of the associated row, 48 half horizontal conductors that extend along each left or right half of the length of the associated row, and four so-called fast conductors that extend along the entire length of the associated row and that are also part of a network that extends along all rows of device 10.

Each column of regions 20 has an associated plurality of inter-region conductors 60. In the illustrative embodiment shown in FIG. 1 each group of conductors 60 includes 20 global vertical conductors that extend along the entire length of the associated column.

Each horizontally adjacent pair of regions 20 is interspersed with local interconnection conductors 70 of various types. Certain local interconnection conductors 70 are also provided at each end of each row. For example, each group of local interconnection conductors includes 22 region feeding conductors 70a. Each of conductors 70a is programmably connectable to any one of several of the conductors 50 that it crosses. These programmable logic connectors ("PLCs") are indicated by the circles 72a in FIG. 1. Thus conductors 70a are usable to bring signals from adjacent conductors 50 into the regions 20 to the left and right of those conductors 70a. Inverting drivers 74a are provided along conductors 70a for strengthening the signals in those conductors. Inverters 76a are level restorers for drivers 74a.

The local outputs of the subregions 30 that are adjacent to each group of conductors 70 are connected to conductors 70b in that group. Conductors 70b are usable to apply the local outputs to selected ones of conductors 50 and 60 via PLCs 80 and 82, respectively. The upper portions of some of conductors 70b are alternatively usable to make connections from conductors 50 to conductors 60 (and/or to other conductors 50) via conductors 84, inverters 86, PLCs 88, and PLCs 82 (and/or PLCs 80). Inverting drivers 71b are provided in conductors 70b to strengthen the signals on those conductors.

The global outputs of the subregions 30 that are adjacent to each group of conductors 70 are connected to conductors 70c in that group. Conductors 70c are usable to apply the global outputs to selected ones of conductors 50 and 60 via PLCs 90 and 92, respectively. The upper portions of conductors 70c are alternatively usable to make connections from conductors 60 to conductors 50 (and/or other conductors 60). These connections are made via PLCs 94, inverters 96, PLCs 98, and PLCs 90 (and/or PLCs 92). Inverting drivers 71c are provided in conductors 70c to strengthen the signals on those conductors.

Each subregion 30 has two main data input conductors 40 coming from the left and two main data input conductors 40 coming from the right. Each of conductors 40 is programmably connectable via PLCs to any of the conductors 70a and 70b that it crosses. PLCs are not provided between conductors 70c and 40. Conductors 40 can therefore bring data signals into the associated subregions 30 from the conductors 70a and 70b on each side of the associated subregion.

At each end of each row of regions 20 is a plurality of input/output pins 100. In the embodiment shown in FIG. 1, for example, there are ten input/output pins 100 at each end of each row of regions 20. For use as an output pin each of pins 100 has an associated tri-state driver 102. Each tri-state driver 102 has a data input terminal and an output enable terminal. When the signal applied to the output enable terminal of a tri-state driver is low, the driver is tri-stated (i.e., has a high impedance at its output terminal). When the signal applied to the output enable terminal of a tri-state driver is high, the driver is enabled to drive the signal applied to its data input terminal to its output terminal. The data input terminal of each tri-state driver 102 is fed from the output terminal of an associated PLC 104. Each PLC 104 is programmable to select either the true or the complement of the signal on an associated lead 108. (The complement signal is produced by an associated inverter 106.) Each of leads 108 is programmably connectable by PLCs to any of the conductors 70a, 70b, and 70c that it crosses. The output enable input terminal of each tri-state driver 102 is fed from the output terminal of another associated PLC 110. Each PLC 110 is programmable to select either the true or the complement of the signal on an associated lead 114. (The complement signal is produced by an associated inverter 112.) Each of leads 114 is programmably connectable by PLCs to any of the conductors 70a, 70b, and 70c that it crosses.

For use as an input pin each of pins 100 is connectable to several of the adjacent conductors 50 via drivers 120 and 122 and PLCs 124. (The fast conductors in group 50 may be excluded from these connections.)

At each end of each adjacent pair of columns of regions 20 there are more input/output pins 130. In the embodiment shown in FIG. 1, for example, there are two input/output pins 130 at each end of each column. For use as an output pin each of pins 130 has an associated tri-state driver 132. Each tri-state driver 132 has a data input terminal and an output enable terminal and operates in the same way that has been described above for tri-state drivers 102. The data input terminal of each tri-state driver 132 is fed from the output terminal of an associated PLC 134. Each PLC 134 is programmable to select either the true or the complement of the signal on an associated lead 138. (The complement signal is produced by an associated inverter 136.) Each of leads 138 is programmably connectable by PLCs to any of the conductors 70a and 70b that it crosses. The output enable input terminal of each tri-state driver 132 is fed from the output terminal of another associated PLC 140. Each PLC 140 is programmable to select either the true or the complement of the signal on an associated lead 144. (The complement signal is produced by an associated inverter 142.) Each of leads 144 is programmably connectable by PLCs to any of the conductors 70a and 70b that it crosses.

For use as an input pin each of pins 130 is connectable to several of the adjacent conductors 60 via drivers 150 and 152 and PLCs 154.

Conductors 170 (two of which are provided along each side of device 10) extend to all of the rows of regions 20 on the device. The same is true for conductors 180, two of which are provided along each side of device 10. Each of conductors 170 receives an input signal from an associated fast input pin (not shown in FIG. 1 but shown representatively at 210 in FIG. 3) of device 10. Each of conductors 180 receives a signal from an associated conductor like conductors 108 in a row near the vertical center of the device. PLCs 172 and drivers 174 and 176 allow the signals on conductors 170 and 180 to be selected and applied to the fast conductors in each group of conductors 50.

Figure 3:
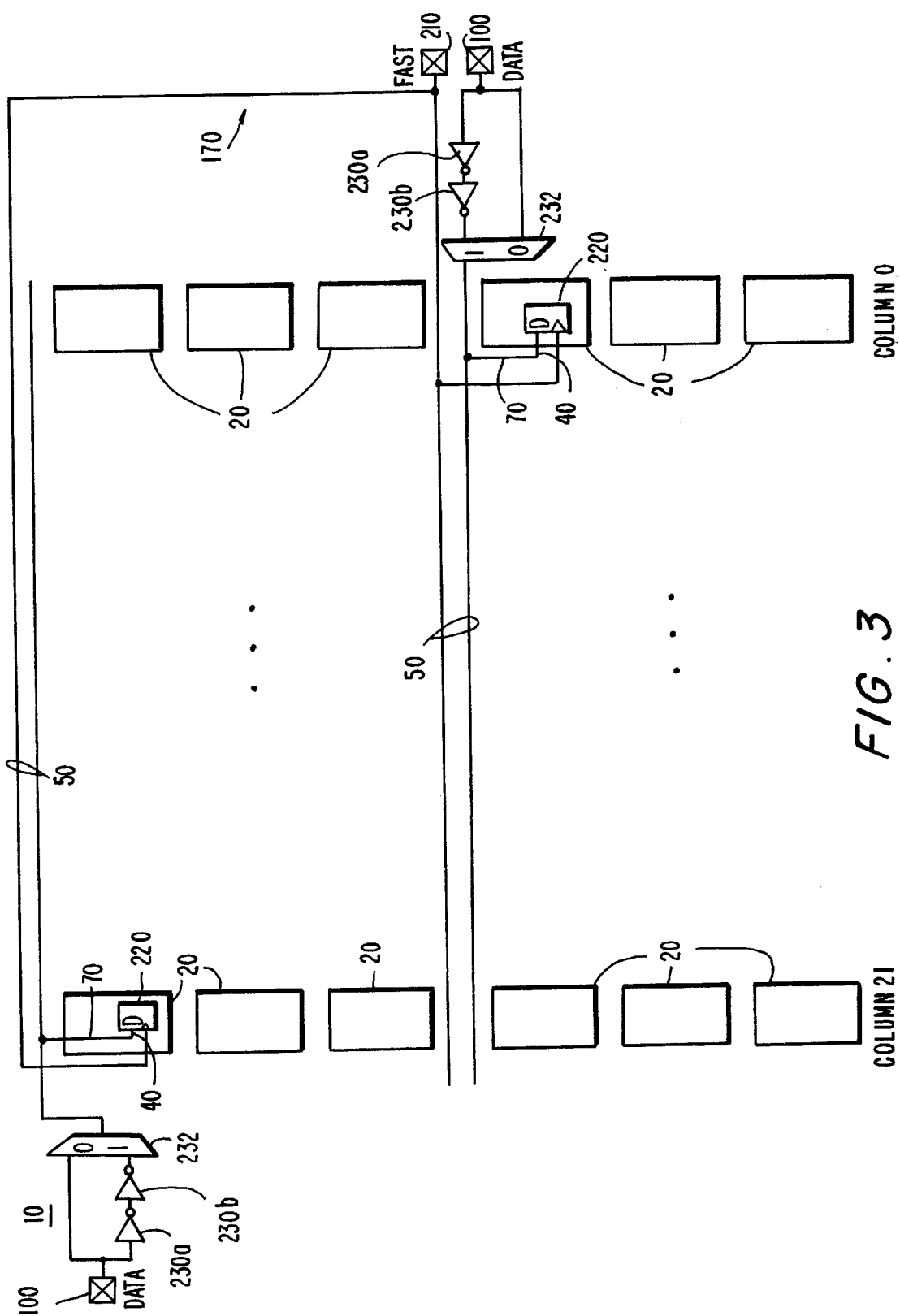
FIG. 3 is a simplified schematic block diagram of an illustrative embodiment of other representative portions of the FIG. 1 device.

FIG. 3 shows that device 10 may have 22 columns and six rows of regions 20. FIG. 3 further shows that a fast input pin 210 on device 10 may be used to receive a clock input applied to the device. For example, this clock signal may be the PCI clock signal. FIG. 3 still further shows that the fast conductor network (including conductors 170 and fast conductors 50) may be used to distribute this clock signal to the clock input terminals of registers 220 in at least some of the subregions 30 in various regions 20. Ignoring, for the moment, elements 230 and 232, FIG. 3 also shows that conductors 50, 70, and 40 allow data signals applied to pins 100 (used as input pins) to be applied to the data input terminals of registers 220. (FIG. 3 does not show the look-up table logic 212 shown in FIG. 2, but it will be understood that data reaches the data input terminal of each register 220 in FIG. 3 via such logic 212.) The data input signals shown in FIG. 3 may be PCI bus data signals.

There is inevitably some delay in transmitting a data signal from a data pin 100 to the D input terminal of a flip-flop 220. FIG. 3 shows that to minimize and standardize such delay, it is good practice to have each data pin 100 feed the D input terminal of a flip-flop 220 that is relatively close to that pin 100. The clock signal, on the other hand, may be applied to a fast input 210 that is relatively close to some of these flip-flops, but relatively far from others of these flip-flops. In the example shown in FIG. 3, the fast input pin 210 that is used for the clock signal is relatively close to the flip-flop 220 on the right, but relatively far from the flip-flop on the left.

The PCI bus specification provides that a data signal may be available as little as 7 nanosecond prior to a clock signal transition, and that the data signal may end as little as 0 nanoseconds after that clock signal transition. The first of these parameters is TSU. The second parameter is THD. If for some actual PCI data the hold time is relatively short (i.e., at or near the 0 nanosecond minimum), the time required for the clock signal to travel through device 10 to flip-flops 220 that are relatively distant from the clock input pin 210 may be great enough that THD will have expired at such a flip-flop before the clock signal transition can reach that flip-flop. A flip-flop 220 that thus receives its clock signal somewhat delayed due to propagation delay on device 10 may therefore fail to register data signals with relatively short hold time.

To reduce the risk of this happening, data input paths that may be used for PCI data include programmable delay circuits such as are shown in FIG. 3. In the illustrative embodiment shown in FIG. 3, each programmable delay circuit comprises elements 230 and 232. Elements 230 are multiple inverters (e.g., 230a and 230b) connected in series to delay the data signal passing through them from the associated data input pin 100 to one input terminal of the associated PLC 232. A second parallel connection between the data input pin 100 and the other input terminal of the PLC 232 does not include any delay elements and therefore does not significantly delay the data signal passing along that path. Each PLC 232 is programmable to select either the delayed or undelayed version of the data signal from the associated data pin 100. The selected version of the data signal is passed on to the remainder of device 10.

The delay chains of elements 230 are typically used for data pins 100 and associated registers 220 that are relatively remote from the clock input pin. The delay chains of elements 230 are typically not used for data pins 100 and associated registers 220 that are relatively close to the clock input pin. In the particular example shown in FIG. 3, the delay chain of elements 230 would be used for the data input pin 100 and register 220 on the left, but the undelayed path (parallel to the delay chain of elements 230) would be used for the data input pin 100 and register 220 on the right.

The amount of delay available using a delay chain of elements 230 may differ depending on other parameters of device 10. However, a typical delay that can be provided by a chain of elements 230 may be about 3 nanoseconds. Given the relatively small minimum value of THD specified by the PCI bus standard (i.e., minimum THD=0), it may be desirable to design device 10 so that all data is delayed somewhat more than clock signals. On the other hand, it is not desirable for this delay to be too large because it slows down device response in all applications. Moreover, such data delay should not be so great that it exceeds the relatively small minimum value of TSU (i.e., 7nanoseconds), because then the flip-flop may be clocked before the data arrives at the flip-flop, thereby preventing the flip-flop from registering the data.

In sum, for data pins 100 and associated registers 220 that are disposed on device 10 relatively close to clock input pin 210, the delay chains of elements 230 are not used because the clock signal will arrive at the registers between the minimum times for TSU and THD. Indeed, in these instances, using the delay chains of elements 230 could cause the registers to be clocked ahead of the arrival of the data at the registers when the data has TSU at or near the minimum value (i.e., 7 nanoseconds). For data pins 100 and associated registers that are disposed on device 10 relatively far from clock input pin 210, the delay chains of elements 230 are used to bring the data back into the proper time relationship to the clock signal as the data and clock signals are applied to the registers. In particular, this additional data delay ensures that the data arrives at these registers at a time that is between the minimum values for TSU (i.e., 7 nanoseconds) and THD (i.e., 0 nanoseconds).

The foregoing is just one example of how programmable delay chains can be used in accordance with this invention to help ensure that data arrives at registers of a programmable logic device within the PCI TSU to THD time interval relative to arrival of a clock signal transition at those registers. Instead of basing the decision as to whether or not to use each programmable delay chain on only distance of the register from the clock input pin, that decision can alternatively or additionally be based on such other factors as distance of the register from the data input pin, loading (and therefore speed) of the conductors between the clock and/or data input pins and the register, loading (and therefore speed) of the switching (such as PLCs 72a) between the clock and/or data input pins and the register, and any other relevant operating characteristics of the device as those operating characteristics apply to the timing of the arrival of clock and data signals to particular registers. For convenience herein and in the appended claims, all such characteristics may be referred to as clock or data signal propagation timing characteristics. Thus each programmable delay chain of elements 230 can be either used or not used to ensure arrival of the associated data signal and a clock signal at a desired register within the PCI TSU to THD time interval depending on the data and clock signal propagation timing characteristics applicable to the transmission of the data and clock signals to that register.

If a data input pin does not drive an input register, then the delay chain of elements 230 for that input pin can be turned off to achieve faster speed because there are no TSU or THD concerns.

Figure 4:
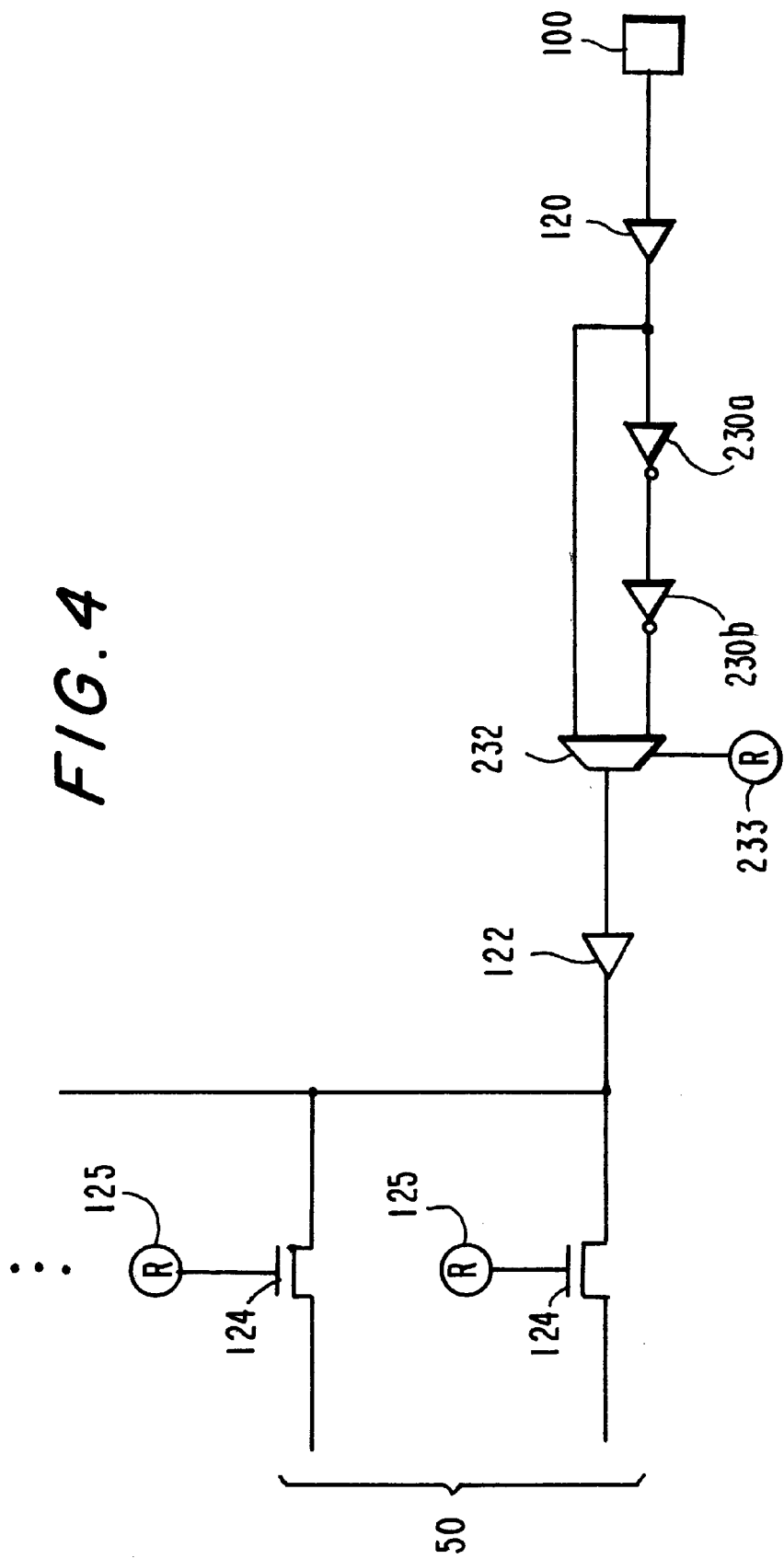
FIG. 4 is a simplified schematic block diagram of an illustrative embodiment of still other representative portions of the FIG. 1 device.

Compatibility with the above-considered PCI standards for input purposes is also facilitated by having data pins 100 and 130 more directly connected to global conductors 50 and 60, respectively. As shown in FIG. 4, for example, there is preferably no switching (other than for programmable delay elements 230 and 232) of input signals from pins 100 prior to drivers 122. The outputs of drivers 122 can then be switched onto any of several conductors 50 by PLCs 124 (controlled by programmable function control elements ("FCEs") 125). (FIG. 4 also shows a typical FCE 233 for controlling an associated PLC 232.)

With regard to meeting the PCI specification for output signal timing (i.e., TCO and TCZ), structures of the type shown in FIG. 1 are particularly advantageous because the subregions 30 near the periphery of device 10 are very closely coupled to the adjacent pins 100 and 130. For example, there is relatively little switching between these subregions 30 and the adjacent pins 100 and 130. The switching that is provided, however, has the ability to locally program active high or active low for either data or output enable of tri-state drivers 102. It is not necessary to use other subregions 30 to provide any of these options. One subregion 30 can be used to provide the output enable signal for all the output pins 100/130 served by the region 20 that includes that subregion. These various structural features help device 10 meet the PCI standards for TCO and TCZ. In particular, these structural features help device 10 output data or a high impedance within 11 nanoseconds after a PCI bus clock signal. In other words, within TCO=11 nanoseconds after a PCI clock signal is applied to device 10, the register 220 in a subregion 30 adjacent a pin 100 or 130 can receive that clock signal and can respond to that clock signal by beginning to output data L or G which passes through the output stage switching and drivers of the device to those adjacent pins 100 or 130. Similarly, within TCO (or TCZ)= 11 nanoseconds after a PCI clock signal is applied to device 10, the register in a subregion 30 adjacent a pin 100 or 130 can receive that clock signal and can respond to that clock signal by beginning to output data L or G which passes through the output stage switching to enable or tri-state the drivers 102 serving those adjacent pins 100 or 130.

The foregoing advantages of device 10 are preferably provided without the need for specially constructed input/output subregions 30. In other words, the subregions 30 that are closely associated with input/output pins 100/130 are preferably the same as or not significantly different from other subregions 30 on the device. These subregions are therefore fully available to perform logic like all the other subregions. It is not necessary to devote a portion of the area of device 10 to circuitry that is specially adapted to meet the PCI bus standard.

The provision of elements such as 104, 106, 110, and 112 for horizontal output pins 100, and such as 134, 136, 140, and 142 for vertical output pins 130 has another important benefit. These elements allow any unused output pin to be programmed high (logic 1), low (logic 0), or tri-stated (high impedance). If an output pin is not used, then conductors 108 and 114 (for a horizontal output pin 100) or 138 and 144 (for a vertical output pin 130) will be pulled high by default because no PLC is programmed to apply a signal to those conductors. (The default could alternatively be low rather than high.) By appropriately programming the associated elements 104/106/110/112 or 134/136/140/142, these default high (or low) signals can be used to cause the associated output pin 100 or 130 to be high, low, or tri-stated. It is not necessary to use other elements such as conductors 70a to apply particular signals to unused output pins 100 or 130. Such waste of other valuable resources is therefore avoided.

Figure 5:
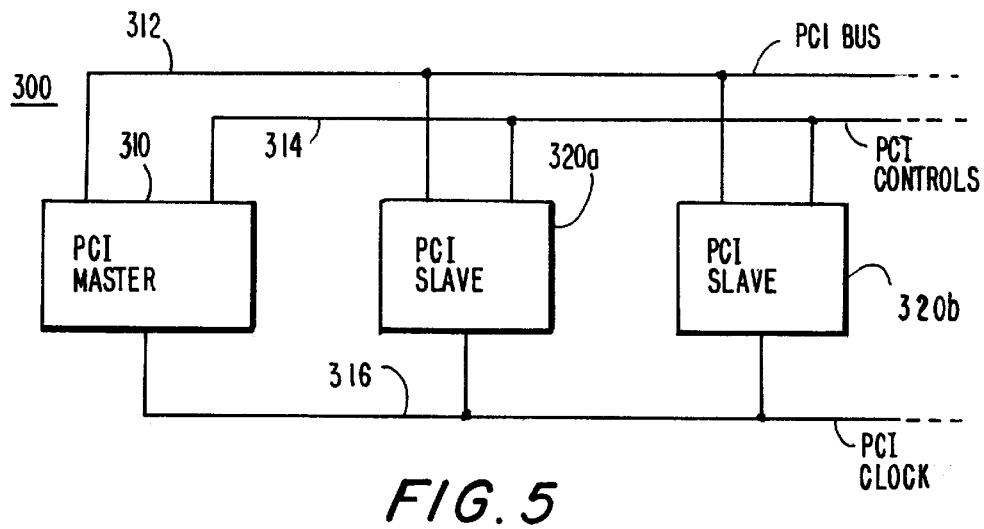
FIG. 5 is a simplified block diagram of an illustrative PCI network which can include programmable logic devices constructed in accordance with the invention.

FIG. 5 shows a typical PCI bus network 300. This network includes a PCI master device 310 and any number of PCI slave devices 320a, 320b, etc. Devices 310 and 320 are interconnected via a 32 bit PCI data bus 312, a PCI control bus 314, and a PCI clock bus 316. PCI master 310 typically originates the PCI clock and control signals on buses 314 and 316. Data bus 312 is typically bi-directional. The features of device 10 (FIGS. 1–4) that are described above facilitate use of device 10 for any part or all of any of elements 310 and 320. Because device 10 can be PCI compatible, device 10 can interface directly with the various PCI bus components shown in FIG. 5 and can therefore serve as PCI master element 310, as PCI slave elements 320, or as any portions of any of those elements.

Figure 6:
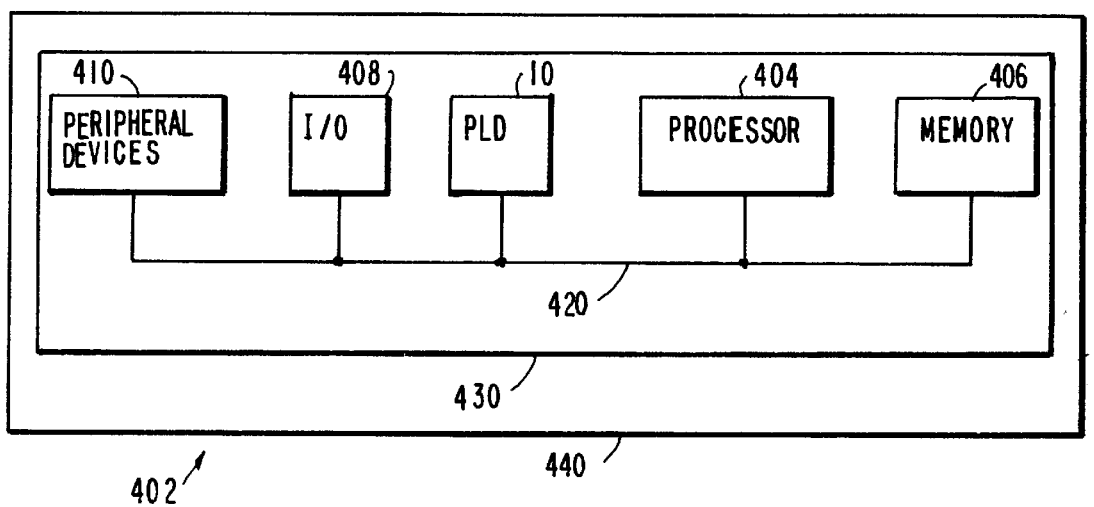
FIG. 6 is a simplified block diagram of an illustrative system employing a programmable logic device in accordance with the invention.

FIG. 6 illustrates a programmable logic device 10 of this invention in a data processing system 402. Data processing system 402 may include one or more of the following components: a processor 404; memory 406; I/O circuitry 408; and peripheral devices 410. These components are coupled together by a system bus 420 and are populated on a circuit board 430 which is contained in an end-user system 440. Bus 420 may be or include a PCI bus, or bus 420 may employ PCI-type signaling.

System 402 can be used in a wide variety of applications, such as computer networking, data networking, instrumentation, video processing, digital signal processing, or any other application where the advantage of using reprogrammable logic is desirable. Programmable logic device 10 can be used to perform a variety of different logic functions. For example, programmable logic device 10 can be configured as a processor or controller that works in cooperation with processor 404. Programmable logic device 10 may also be used as an arbiter for arbitrating access to a shared resource in system 402. In yet another example, programmable logic device 10 can be configured as an interface between processor 404 and one of the other components in system 402. It should be noted that system 402 is only exemplary, and that the true scope and spirit of the invention should be indicated by the following claims.

The PLCs mentioned throughout this specification (which includes the appended claims) can be implemented in any of a wide variety of ways. For example, each PLC can be a relatively simple programmable connector such as a switch or a plurality of switches for connecting any one of several inputs to an output. Alternatively, each PLC can be a somewhat more complex element which is capable of performing logic (e.g., by logically combining several of its inputs) as well as making a connection. In the latter case, for example, each PLC can be product term logic, implementing functions such as AND, NAND, OR, or NOR. Examples of components suitable for implementing PLCs are EPROMs, EEPROMs, pass transistors, transmission gates, antifuses, laser fuses, metal optional links, etc. The components of PLCs can be controlled by various, programmable, function control elements ("FCEs"), which are not always shown separately in the accompanying drawings. (With certain PLC implementations (e.g., fuses and metal optional links) separate FCE devices are not required.) FCEs can also be implemented in any of several different ways. For example, FCEs can be SRAMs, DRAMs, first-in first-out ("FIFO") memories, EPROMs, EEPROMs, function control registers (e.g., as in Wahlstrom U.S. Pat. No. 3,473,160), or the like. From the various examples mentioned above it will be seen that this invention is applicable both to one-time-only programmable and reprogrammable devices.

It will be understood that the foregoing is only illustrative of the principles of the invention and that various modifications can be made by those skilled in the art without departing from the scope and spirit of the invention. For example, the particular logic elements and groups of logic elements that have been shown for performing various functions are only illustrative, and other logically equivalent structures can be used instead if desired. The use of look-up tables for performing the basic logic of the subregions is also only illustrative, and the subregions can instead be implemented in other ways, in which other types of logic are performed. For example, the subregions could include sum-of-products logic implemented using EPROM devices. The use of serially connected inverters 230 to produce delay is only illustrative, and any other suitable delay-producing elements can be used instead if desired. The programmable delay networks of elements 230 and 232 can be constructed with more than two delay options if desired. For example, each such network could include several delay chains having different amounts of delay in addition to the undelayed path, and PLC 232 could be programmable to select any of these chains or the undelayed path. This would increase the number of available delay options.

What is claimed is:

1. A programmable logic device comprising:

a plurality of input/output pins, each of which is configurable for use as an output pin or an input pin, and includes an associated tri-state driver with a data input terminal and an output enable terminal;

a plurality of regions of programmable logic, each of which includes a register having a clock signal input terminal, a data signal input terminal, and a data signal output terminal and configured to respond to a clock signal applied to the clock signal input terminal by applying to the data signal output terminal a data output signal indicative of the signal concurrently applied to the data signal input terminal;

a clock signal input pin connected to the clock signal input terminals of the registers; and programmable logic connector circuitry configured to selectively couple a data signal output terminal of a selected register to the data input terminals of the associated tri-state drivers of a subset of the input/output pins with fast conductors so that delay between application of a clock signal to the clock signal input pin and application of a data output signal from each input/output pin in the subset of the input/output pins indicative of the signal applied to the data signal input terminal of the selected register is within the PCI TCO time interval.

2. The device defined in claim 1 wherein the subset of the input/output pins is configured to be a grouping of any of the input/output pins.

3. The device defined in claim 1 wherein each input/output pin belongs to a subset of similar input/output pins on the device, the input/output pins in the subset being the closest of all of the input/output pins to the selected register.

4. The device defined in claim 1 wherein the programmable logic connector circuitry includes:

programmable inversion circuitry associated with each of the tri-state drivers and configured to selectively apply either the true or complement of a data output signal from a register to the data input terminal of each of the tri-state drivers.

5. The device defined in claim 1 wherein the programmable logic connector circuitry includes:

programmable inversion circuitry associated with each of the tri-state drivers and configured to selectively apply either the true or complement of a data output signal from a register to the output enable terminal of each of the tri-state drivers.

6. A programmable logic device comprising:

a plurality of input/output pins, each of which is configurable for use as an output pin or an input pin, and includes an associated tri-state driver with a data input terminal and an output enable terminal;

a plurality of regions of programmable logic, each of which includes a register having a clock signal input terminal, a data signal input terminal, and a data signal output terminal and configured to respond to a clock signal applied to the clock signal input terminal by applying to the data signal output terminal a data output signal indicative of the signal concurrently applied to the data signal input terminal;

a clock signal input pin connected to the clock signal input terminals of the registers; and programmable logic connector circuitry configured to selectively couple a selected input/output pin to the data signal input terminals of a subset of the registers with fast conductors so that delay between application of a clock signal to the clock signal input pin and application of a data input signal from the selected input/output pin to the data signal input terminals of the subset of the registers is within the PCI TSU time interval.

7. The device defined in claim 6 wherein the programmable logic connector circuitry is configured to selectively couple the selected input/output pin to the data signal input terminals of the subset of the registers with fast conductors so that delay between application of a clock signal to the clock signal input pin and application of the data input signal from the selected input/output pin to the data signal input terminals of the subset of the registers is within the PCI THD time interval.

8. The device defined in claim 6 wherein the subset of registers is configured to be a grouping of any of the registers.

9. The device defined in claim 6 wherein each register in each of the regions of programmable logic belongs to a subset of similar registers on the device, the registers in the subset being the closest of all of the registers to the selected input/output pin.

10. The device defined in claim 6 wherein the programmable logic connector circuitry includes:

programmable inversion circuitry associated with each of the tri-state drivers and configured to selectively apply either the true or complement of a data output signal from a register to the data input terminal of each of the tri-state driver.

11. The device defined in claim 6 wherein the programmable logic connector circuitry includes:

programmable inversion circuitry associated with each of the tri-state drivers and configured to selectively apply either the true or complement of a data output signal from a register to the output enable terminal of each of the tri-state drivers.

12. A programmable logic device comprising:

a plurality of input/output pins, each of which is configurable for use as an output pin or an input pin, and includes an associated tri-state driver with a data input terminal and an output enable terminal;

a plurality of regions of programmable logic, each of which includes a register having a clock signal input terminal, a data signal input terminal, and a data signal output terminal and configured to respond to a clock signal applied to the clock signal input terminal by applying to the data signal output terminal a data output signal indicative of the signal concurrently applied to the data signal input terminal;

a clock signal input pin connected to the clock signal input terminals of the registers; and programmable logic connector circuitry configured to selectively couple the data signal output terminal of a first selected register to the data input terminals of the associated tri-state drivers of a subset of the input/output pins and configured to selectively couple the data signal output terminal of a second selected register to the output enable terminals of the associated tri-state drivers of the subset of the input/output pins with fast conductors so that delay between application of a clock signal to the clock signal input pin and application of a data output signal from each input/output pin in the subset of the input/output pins indicative of the signal applied to the data signal input terminal of the first selected register is within the PCI TCZ time interval.

13. The device defined in claim 12 wherein the subset of the input/output pins is configured to be a grouping of any of the input/output pins.

14. The device defined in claim 12 wherein each input/output pin belongs to a subset of similar input/output pins on the device, the input/output pins in the subset being the closest of all of the input/output pins to the first selected register and the second selected register.

15. The device defined in claim 12 wherein the programmable logic connector circuitry includes:

programmable inversion circuitry associated with each of the tri-state drivers and configured to selectively apply either the true or complement of a data output signal from a register to the data input terminal of each of the tri-state drivers.

16. The device defined in claim 12 wherein the programmable logic connector circuitry includes:

programmable inversion circuitry associated with each of the tri-state drivers and configured to selectively apply either the true or complement of a data output signal from a register to the output enable terminal of each of the tri-state drivers.

* * * * *

UNITED STATES PATENT AND TRADEMARK OFFICE
CERTIFICATE OF CORRECTION

PATENT NO.    : 6,646,467 B1
DATED         : November 11, 2003
INVENTOR(S)   : Richard G. Cliff et al.

It is certified that error appears in the above-identified patent and that said Letters Patent is hereby corrected as shown below:

<u>Title page,</u>
Item [75], Inventors, change "Bruce B. Pendersen" to -- Bruce B. Pedersen --.

Signed and Sealed this

Sixth Day of July, 2004

JON W. DUDAS
*Acting Director of the United States Patent and Trademark Office*